United States Patent
You

(10) Patent No.: US 12,176,056 B2
(45) Date of Patent: Dec. 24, 2024

(54) SEMICONDUCTOR DEVICE CONFIGURED TO STORE PARITY DATA AND METHOD OF OPERATING THE SEMICONDUCTOR DEVICE

(71) Applicant: SK hynix Inc., Icheon-si (KR)

(72) Inventor: Byoung Sung You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 101 days.

(21) Appl. No.: 18/075,003

(22) Filed: Dec. 5, 2022

(65) Prior Publication Data
US 2024/0021223 A1 Jan. 18, 2024

(30) Foreign Application Priority Data
Jul. 12, 2022 (KR) .................. 10-2022-0085746

(51) Int. Cl.
| | | |
|---|---|---|
| G11C 7/10 | (2006.01) | |
| G06F 11/10 | (2006.01) | |
| G11C 7/12 | (2006.01) | |
| G11C 29/42 | (2006.01) | |

(52) U.S. Cl.
CPC .......... *G11C 7/1039* (2013.01); *G06F 11/108* (2013.01); *G11C 7/1012* (2013.01); *G11C 7/1051* (2013.01); *G11C 7/12* (2013.01); *G11C 29/42* (2013.01)

(58) Field of Classification Search
CPC ... G11C 7/1039; G11C 7/1012; G11C 7/1051; G11C 7/12; G11C 29/42; G06F 11/108
See application file for complete search history.

(56) References Cited

U.S. PATENT DOCUMENTS 9,881,696 B2 * 1/2018 Lee ..................... G06F 11/108

FOREIGN PATENT DOCUMENTS

KR 102248207 B1 5/2021

* cited by examiner

*Primary Examiner* — Son L Mai
(74) *Attorney, Agent, or Firm* — WILLIAM PARK & ASSOCIATES LTD.

(57) ABSTRACT

A semiconductor device includes a memory cell array and a plurality of read and write circuits. The memory cell array includes a plurality of planes. Any one of the read and write circuits generates parity data based on data sequentially received from a controller through a channel.

19 Claims, 17 Drawing Sheets

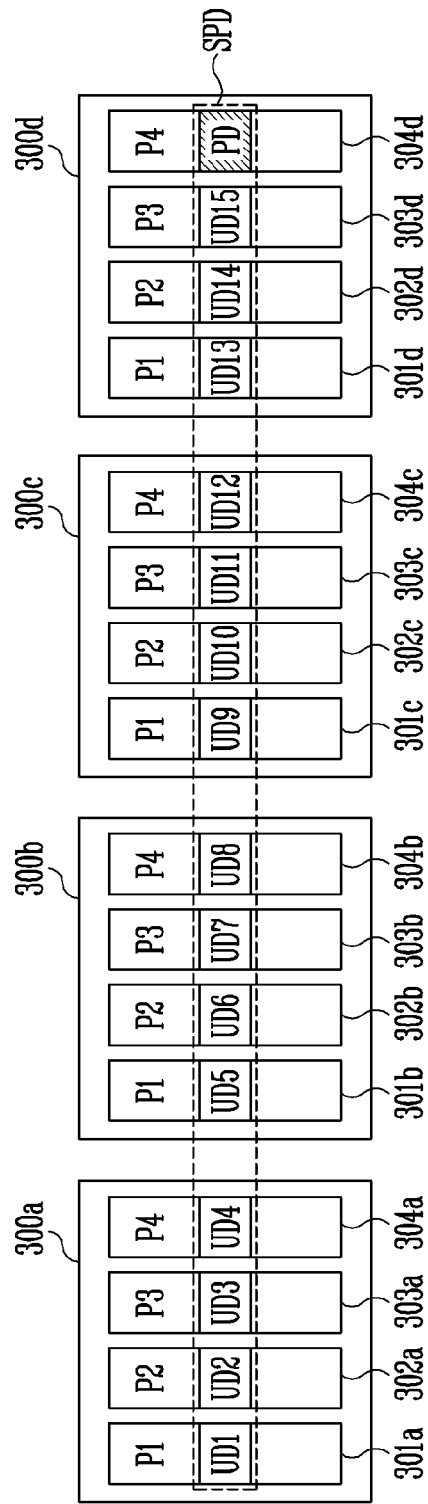

| PGM ADDR | PARITY ADDR | DATA |

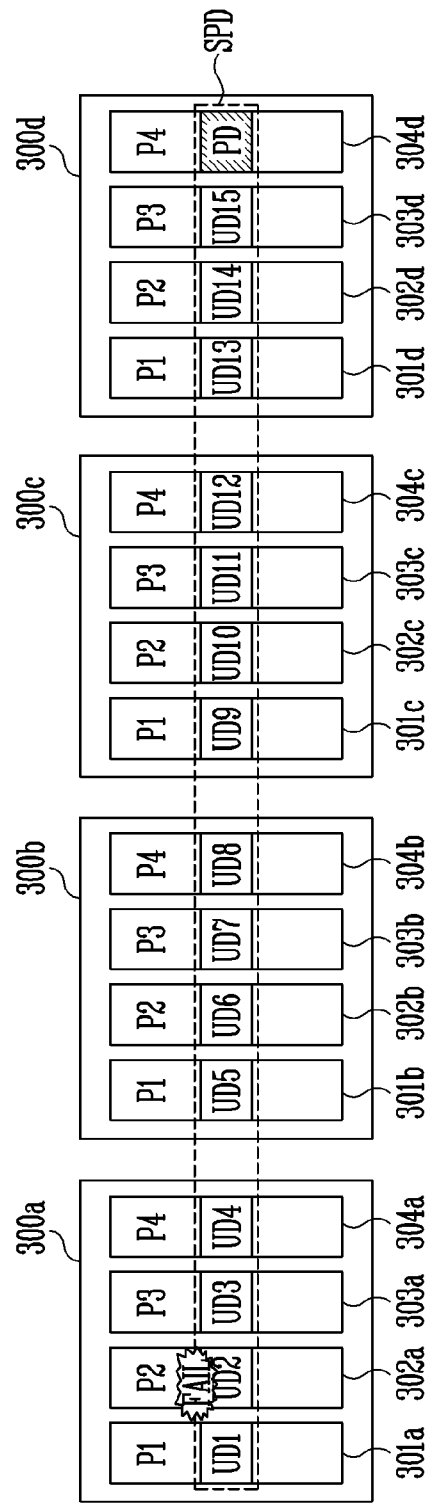

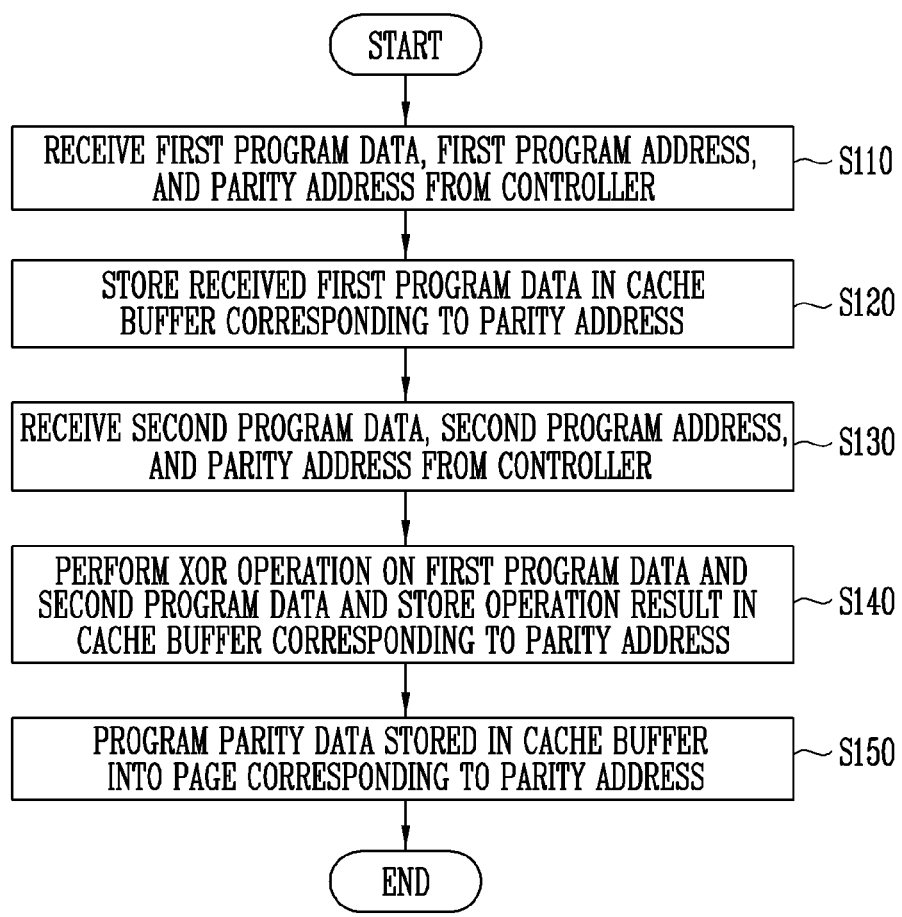

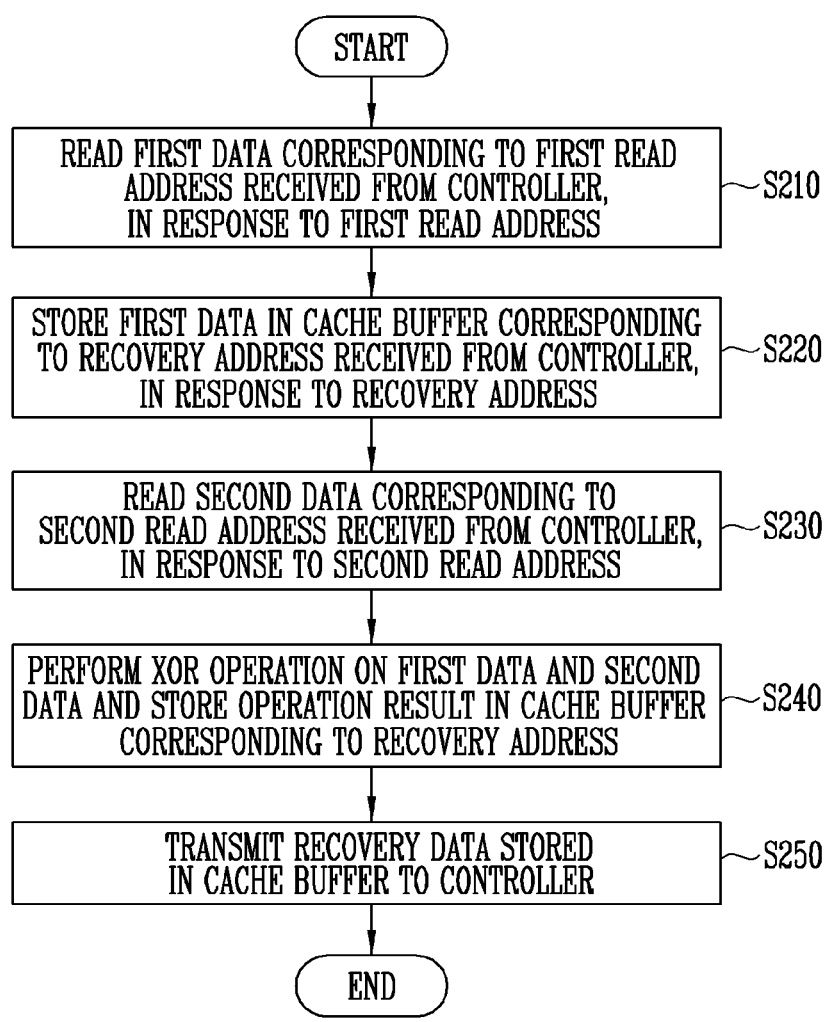

SEMICONDUCTOR DEVICE CONFIGURED TO STORE PARITY DATA AND METHOD OF OPERATING THE SEMICONDUCTOR DEVICE

CROSS-REFERENCE TO RELATED APPLICATION

The present application claims priority under 35 U.S.C. § 119(a) to Korean patent application number 10-2022-0085746, filed on Jul. 12, 2022, in the Korean Intellectual Property Office, the entire disclosure of which is incorporated herein by reference.

BACKGROUND

1. Technical Field

The present disclosure relates to an electronic device, and more particularly, to a semiconductor device configured to store parity data and a method of operating the semiconductor device.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a semiconductor memory device designed in order to resolve a limit of an integration degree of a two-dimensional semiconductor memory device, and may include a plurality of memory cells that are vertically stacked on a semiconductor substrate.

A controller may control an operation of the semiconductor memory device. Specifically, in response to a request received from a host, the controller controls the semiconductor memory device to perform an operation corresponding to the request by transmitting a command to the semiconductor memory device.

SUMMARY

According to an embodiment of the present disclosure, a semiconductor device may include a memory cell array and a plurality of read and write circuits. The memory cell array may include a plurality of planes. Any one of the read and write circuits may generate parity data based on data sequentially received from a controller through a channel.

According to another embodiment of the present disclosure, a method of operating a semiconductor device may include receiving first program data, a first program address, and a parity address from a controller connected to the semiconductor device through a channel, storing the first program data in a cache buffer corresponding to the parity address, receiving second program data, a second program address, and the parity address from the controller, and generating parity data based on the first and second program data.

According to another embodiment of the present disclosure, a method of operating a semiconductor device may include reading first data in response to a first address received from a controller connected to the semiconductor device through a channel, storing the first data in a cache buffer corresponding to a recovery address received from the controller, in response to the recovery address, reading second data in response to a second address received from the controller, and generating recovery data based on the first and second data.

BRIEF DESCRIPTION OF THE DRAWINGS

FIG. 8 is a diagram illustrating a super page stored in semiconductor memory devices according to an embodiment of the present disclosure.

FIG. 12 is a diagram illustrating a case in which a read fail occurs in partial data of super page data stored in semiconductor memory devices according to an embodiment of the present disclosure.

FIG. 15 is a flowchart illustrating a method of operating a semiconductor memory device according to an embodiment of the present disclosure.

FIG. 16 is a flowchart illustrating a method of operating a semiconductor memory device according to another embodiment of the present disclosure.

DETAILED DESCRIPTION

Specific structural or functional descriptions of embodiments according to the concept which are disclosed in the present specification or application are illustrated only to describe the embodiments according to the concept of the present disclosure, and the embodiments according to the concept of the present disclosure may be implemented in various forms and should not be construed as being limited to the embodiments described in the present specification or application.

An embodiment of the present disclosure provides a semiconductor device and a method of operating the semiconductor device that uses less buffer memory to store parity data.

In an embodiment, a semiconductor device and a method of operating the semiconductor device that uses less buffer memory to store parity data is provided.

Figure 1:
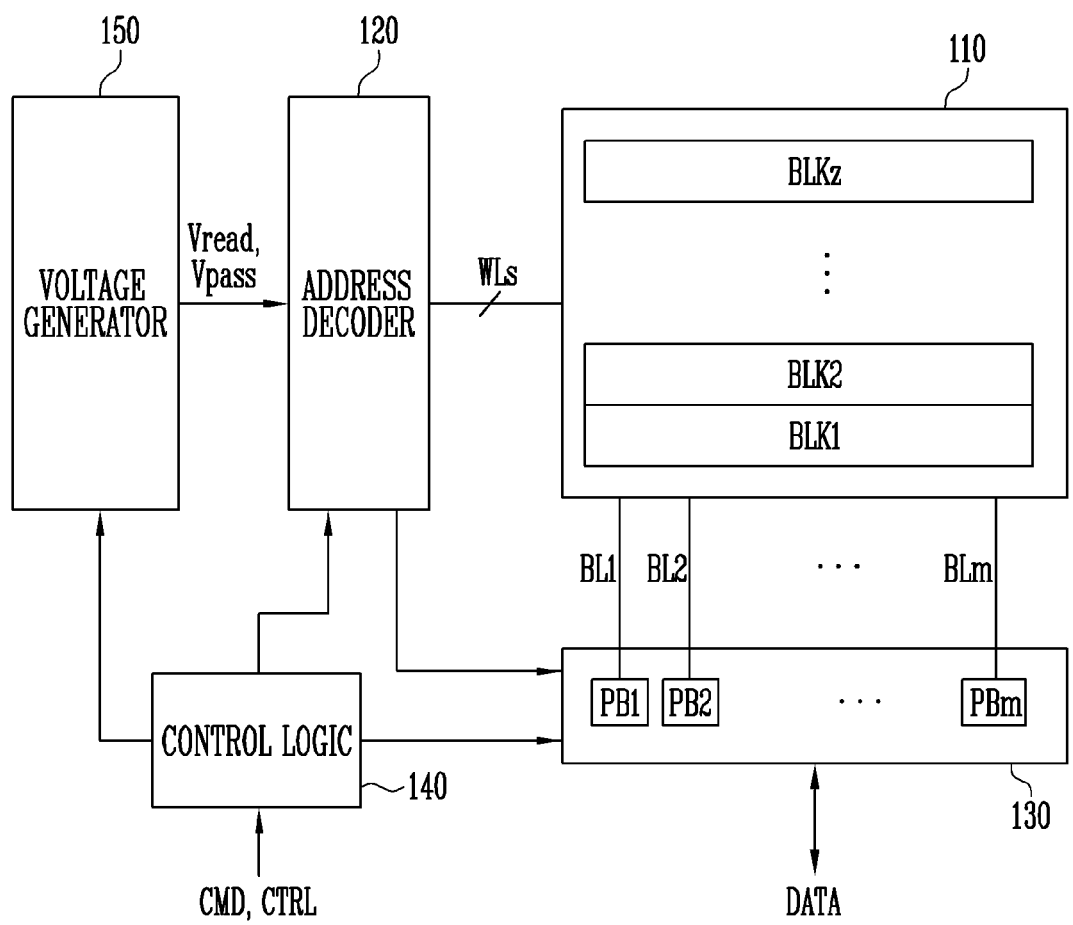
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WLs. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. The peripheral circuit may perform a read operation, a write operation, and an erase operation on the memory cell array 110, based on control of the control logic 140. The address decoder 120 is connected to the memory cell array 110 through the word lines WLs. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during the read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during the read operation of the memory cell array 110 and may operate as a "write circuit" during the write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, stores read data, and outputs data DATA to the input/output buffer (not shown) of the semiconductor memory device 100. As an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. Meanwhile, the voltage generator 150 may further include a voltage regulator in addition to the plurality of pumping capacitors.

Figure 2:
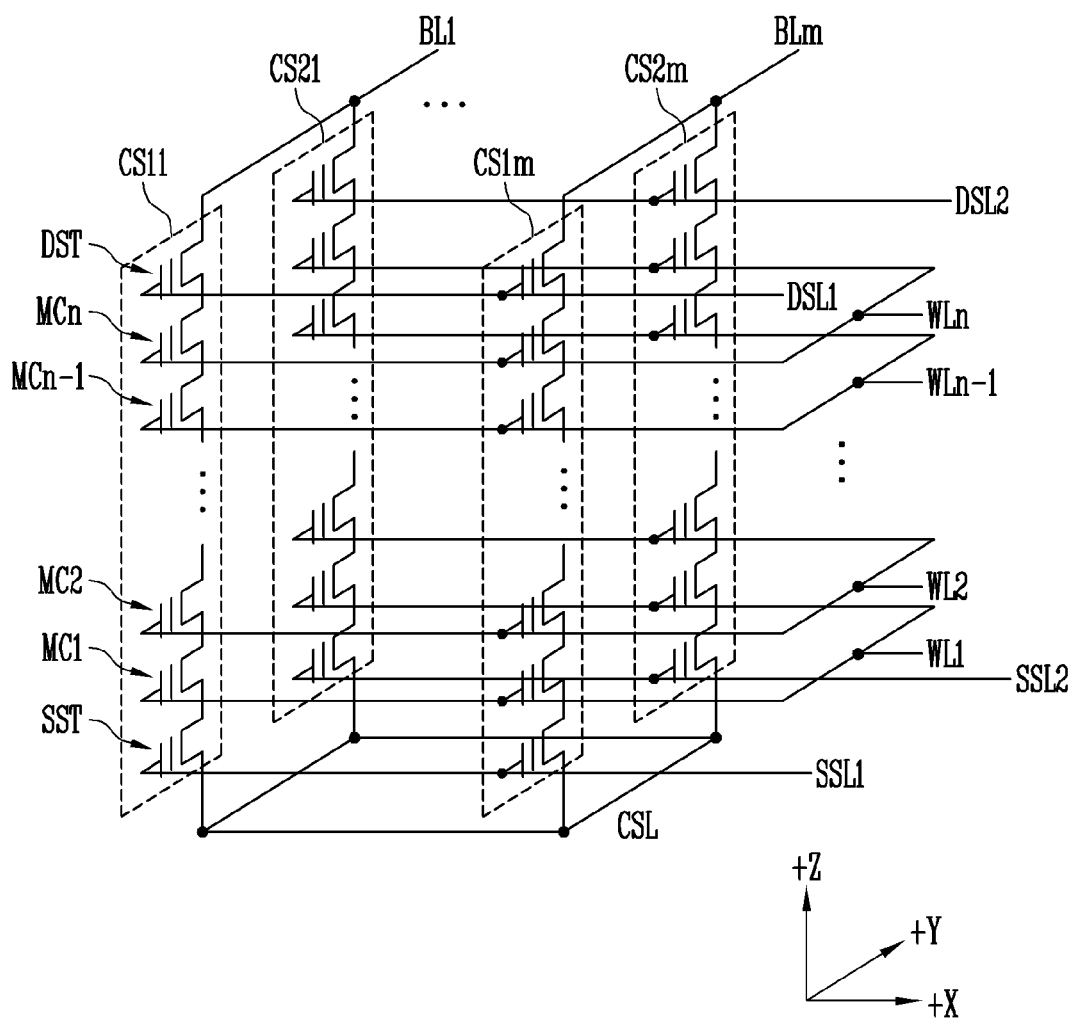
FIG. 2 is a circuit diagram illustrating any one memory block BLKa among memory blocks BLK1 to BLKz of FIG. 1.

FIG. 2 is a circuit diagram illustrating any one memory block BLKa among the memory blocks BLK1 to BLKz of FIG. 1.

Referring to FIG. 2, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 2, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating layer, a charge storage layer, and a blocking insulating layer. As an embodiment, a pillar for providing the channel layer may be provided in each cell string. As an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

As an embodiment, the source select transistors of the cell strings arranged in the same row are connected to a source select line extending in the row direction, and the source select transistors of the cell strings arranged in different rows are connected to different source select lines. In FIG. 2, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected in series between the source select transistor SST and the drain select transistor DST.

The drain select transistor DST of each cell string is connected between a corresponding bit line and the memory cells MC1 to MCn. Cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 2, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one or more dummy memory cells are provided to reduce an electric field between the source select transistor SST and the memory cells MC1 to MCn. Alternatively, at least one or more dummy memory cells are provided to reduce an electric field between the drain select transistor DST and the memory cells MC1 to MCn. In an embodiment, as more dummy memory cells are provided, reliability of an operation for the memory block BLKa is improved, however, the size of the memory block BLKa increases. In an embodiment, as less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed.

The memory block BLKa shown in FIG. 2 may have a three-dimensional structure, but the present disclosure is not limited thereto. For example, the memory cell array of the semiconductor memory device according to the present disclosure may include a memory block having a two-dimensional structure.

Figure 3:
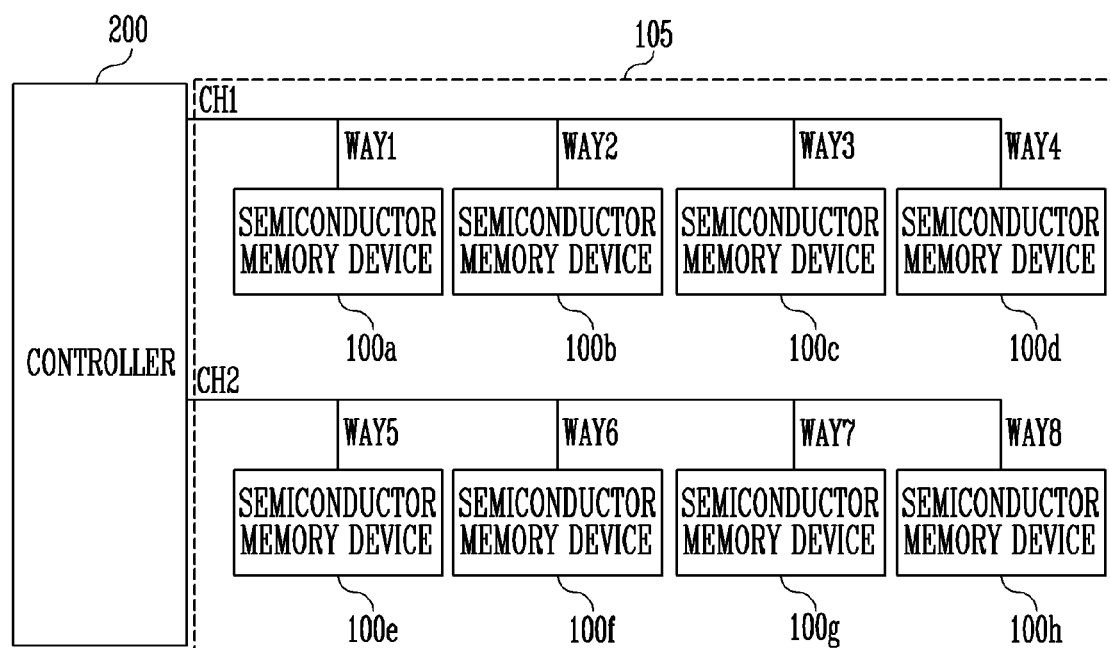
FIG. 3 is a diagram illustrating an example of a storage device including a plurality of semiconductor memory devices.

FIG. 3 is a diagram illustrating an example of a storage device including a plurality of semiconductor memory devices.

Referring to FIG. 3, the storage device 51 includes a controller 200 and a plurality of semiconductor memory devices 100a to 100h. The plurality of semiconductor memory devices 100a to 100h may configure a storage area 105 of the storage device 51. The semiconductor memory devices 100a to 100h are configured to receive a command and an address from the controller 200 through channels CH1 and CH2 and access an area selected by the address in the memory cell array. That is, each of the semiconductor memory devices 100a to 100h may perform an operation corresponding to the command on the area selected by the address. For example, each of the semiconductor memory devices 100a to 100h may perform the write operation (program operation), the read operation, or the erase operation according to the received command. For example, when a program command is received, the semiconductor memory device may program data into the area selected by the address. When a read command is received, the semiconductor memory device may read data from the area selected by the address. When an erase command is received, the semiconductor memory device may erase data stored in the area selected by the address.

As shown in FIG. 3, the storage device 51 according to an embodiment may be configured in a multi-channel and multi-way structure. The multi-channel structure may refer to a structure in which the controller 200 and the semiconductor memory devices 100a to 100h are connected through the plurality of channels CH1 and CH2 so that a plurality of semiconductor memory devices may be accessed simultaneously. In an embodiment, as the number of channels connecting the controller 200 and the semiconductor memory devices 100a to 100h increases, the number of semiconductor memory devices that may be simultaneously controlled by the controller 200 increases, and thus an operation speed of the storage device 51 may be improved. The multi-way structure may refer to a structure in which a plurality of semiconductor memory devices are connected to one channel. For example, four semiconductor memory devices 100a to 100d are connected to a first channel CH1 of the storage device 51 of FIG. 3. In the first channel CH1, the semiconductor memory devices 100a to 100d configure first to fourth ways WAY1 to WAY4, respectively. In addition, in the second channel CH2, the semiconductor memory devices 100e to 100h configure fifth to eighth ways WAY5 to WAY8, respectively. In an embodiment, in the storage device having the multi-way structure, a plurality of semiconductor memory devices connected to one channel may perform an interleaving operation to improve an operation speed. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

As shown in FIG. 3, in the storage device 51 according to an embodiment, the same number of semiconductor memory devices may be connected to each channel. That is, four semiconductor memory devices 100a to 100d are connected to each of the first channel CH1 and the second channel CH2. In another embodiment, different numbers of semiconductor memory devices may be connected to each channel.

The controller 200 may control an overall operation of the storage device 51.

When a power voltage is applied to the storage device 51, the controller 200 may execute firmware (FW). The controller 200 may execute firmware such as a flash translation layer (FTL) for controlling communication between a host and the semiconductor memory devices 100a to 100h.

In an embodiment, the controller 200 may include a firmware capable of receiving data and a logical block address (LBA) from the host and converting the LBA into a physical block address (PBA) indicating an address of memory cells in which data included in the semiconductor memory devices 100a to 100h is to be stored. In addition, the controller 200 may store a logical-physical address mapping table configuring a mapping relationship between the LBA and the PBA in a buffer memory.

The controller 200 may control the semiconductor memory devices 100a to 100h to perform the program operation, the read operation, or the erase operation according to a request of the host. For example, when a program request is received from the host, the controller 200 may convert the program request into a program command, and provide the program command, the PBA, and data to any one of the semiconductor memory devices 100a to 100h. When a read request is received together with the LBA from the host, the controller 200 may convert the read request into a read command, select a PBA corresponding to the LBA, and then provide the read command and the PBA to any one of the semiconductor memory devices 100a to 100h. When an erase request is received together with the logical block address from the host, the controller 200 may convert the erase request into an erase command, select a PBA corresponding to the LBA, and then provide the erase command and the PBA to any one of the semiconductor memory devices 100a to 100h.

In an embodiment, the controller 200 may generate the program command, the address, and the data by itself without the request from the host, and transmit the program command, the address, and the data to at least one of the semiconductor memory devices 100a to 100h. For example, the controller 200 may provide the program command, the address, and the data to at least one of the semiconductor memory devices 100a to 100h to perform background operations such as a program operation for wear leveling and a program operation for garbage collection.

As shown in FIG. 3, the controller 200 may control at least two or more semiconductor memory devices. In this case, in an embodiment, the controller 200 may control the semiconductor memory devices 100a to 100h according to an interleaving method in order to improve operation performance.

Figure 4:
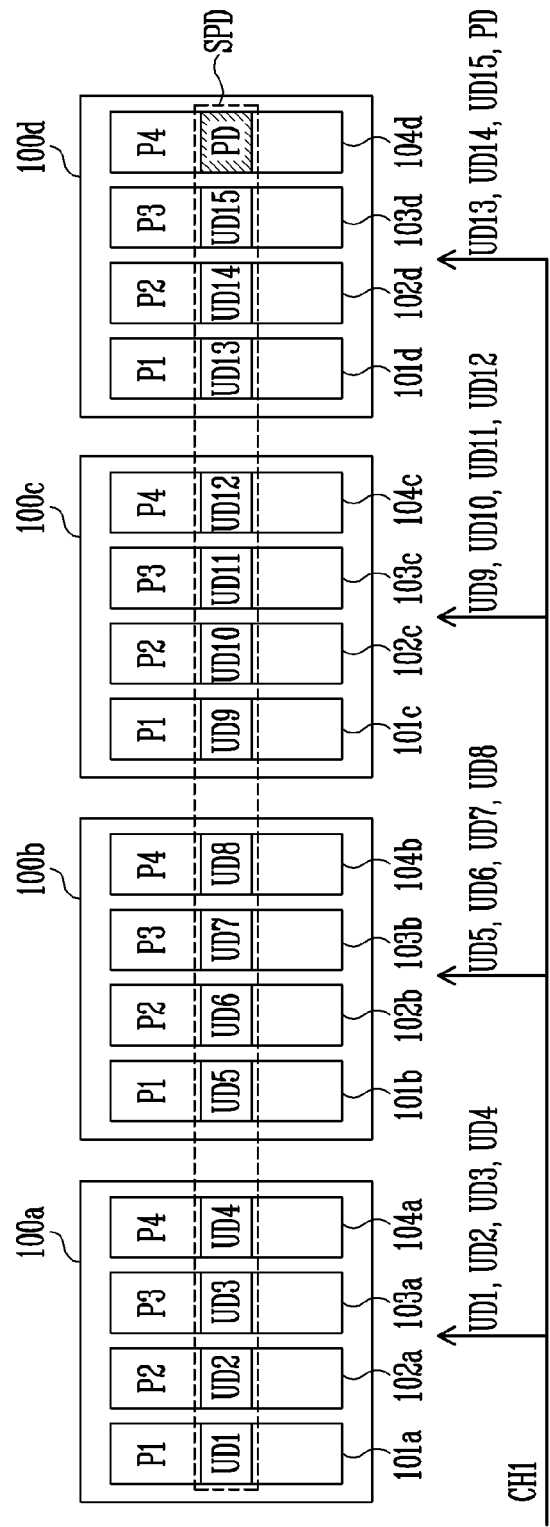
FIG. 4 is a diagram illustrating a super page stored in semiconductor memory devices connected to a first channel.

FIG. 4 is a diagram illustrating a super page stored in semiconductor memory devices connected to the first channel.

Referring to FIG. 4, only four semiconductor memory devices 100a, 100b, 100c, and 100d connected to the first channel CH1 are shown for convenience of discussion. In FIG. 4, each of the semiconductor memory devices 100a, 100b, 100c, and 100d includes four planes P1, P2, P3, and P4. That is, a first semiconductor memory device 100a includes first to fourth planes 101a, 102a, 103a, and 104a, a second semiconductor memory device 100b includes first to fourth planes 101b, 102b, 103b, and 104b, a third semiconductor memory device 100c includes first to fourth planes 101c, 102c, 103c, and 104c, and a fourth semiconductor memory device 100d includes first to fourth planes 101d, 102d, 103d, and 104d.

First to fourth user data UD1 to UD4 may be stored in the first to fourth planes 101a, 102a, 103a, and 104a of the first semiconductor memory device 100a, respectively. Fifth to eighth user data UD5 to UD8 may be stored in the first to fourth planes 101b, 102b, 103b, and 104b of the second semiconductor memory device 100b, respectively. Ninth to twelfth user data UD9 to UD12 may be stored in the first to fourth planes 101c, 102c, 103c, and 104c of the third semiconductor memory device 100c, respectively. Thirteenth to fifteenth user data UD13 to UD15 and parity data PD may be stored in the first to fourth planes 101d, 102d, 103d, and 104d of the fourth semiconductor memory device 100d, respectively.

Each of the first to fifteenth user data UD1 to UD15 and the parity data PD may be data stored in one page. In addition, the first to fifteenth user data UD1 to UD15 and the parity data PD may configure one super page data SPD. In this case, the first to fifteenth user data UD1 to UD15 and the parity data PD may be flushed from the controller 200 at once, and may be programmed into the respective planes 101a to 104a, 101b to 104b, 101c to 104c, and 101d to 104d.

At this time, the first to fourth user data UD1 to UD4 may be transmitted to the semiconductor memory device 100a through the first channel CH1, the fifth to eighth user data UD5 to UD8 may be transmitted to the semiconductor memory device 100b through the first channel CH1, the ninth to twelfth user data UD9 to UD12 may be transmitted to the semiconductor memory device 100c through the first channel CH1, and the thirteenth to fifteenth user data UD13 to UD15 and the parity data PD may be transmitted to the semiconductor memory device 100d through the first channel CH1.

The parity data PD may be generated based on the first to fifteenth user data UD1 to UD15. In an embodiment, the parity data PD may be generated by performing an exclusive-OR (XOR) operation on the first to fifteenth user data UD1 to UD15 in each bit unit. Specifically, a first bit of the parity data PD may be generated by performing an XOR operation on all first bits of the first to fifteenth user data UD1 to UD15. Next, a second bit of the parity data PD may be generated by performing an XOR operation on all second bits of the first to fifteenth user data UD1 to UD15. In addition, a third bit of the parity data PD may be generated by performing an XOR operation on all third bits of the first to fifteenth user data UD1 to UD15. In a method described above, the parity data PD may be generated by performing an XOR operation on the first to fifteenth user data UD1 to UD15.

When a read fail occurs in any one of the first to fifteenth user data UD1 to UD15 based on the above-described parity data PD, the read fail may be recovered. In the present specification, it is described that the "read fail" occurs in a case where read data includes an uncorrectable error. When the uncorrectable error occurs in any one of the first to fifteenth user data UD1 to UD15, data may be recovered by performing an XOR operation on the parity data and remaining user data except for the data in which the error occurs.

In this case, before the first to fifteenth user data UD1 to UD15 are flushed to the semiconductor memory device 100, the controller 200 generates the parity data PD based on the first to fifteenth user data UD1 to UD15. That is, the controller 200 is required to generate the parity data PD, and the controller 200 is required to maintain all of the first to fifteenth user data UD1 to UD15 and the parity data PD in the buffer memory. As a size of the super page data SPD increases, a buffer memory space for maintaining the super page data SPD also increases. This, in an embodiment, may be a burden on a limited buffer memory in the controller 200.

According to an embodiment of the present disclosure, the controller 200 does not generate the parity data, and any one of each semiconductor memory device generates the parity data. Specifically, among the plurality of semiconductor memory devices connected to one channel, a semiconductor memory device to store the parity data generates the parity data. At this time, the corresponding semiconductor memory device generates the parity data based on user data commonly input to a channel.

Therefore, the controller is not required to maintain all of the user data before flushing the user data to the semiconductor memory device. Accordingly, in an embodiment, a capacity of the buffer memory included in the controller may be configured to be small.

Figure 5:
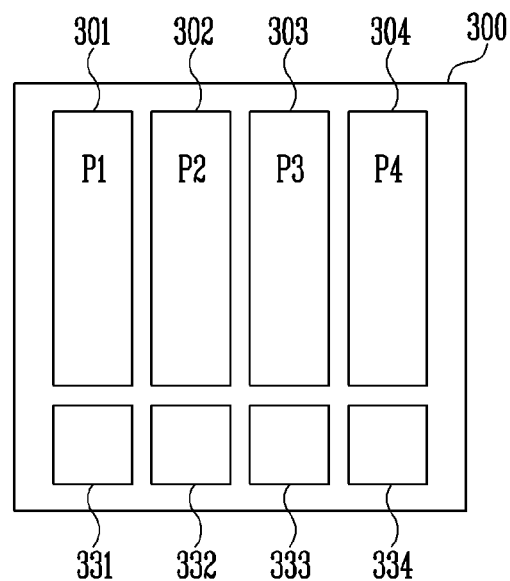
FIG. 5 is a block diagram illustrating a semiconductor memory device according to an embodiment of the present disclosure.

FIG. 5 is a block diagram illustrating a semiconductor memory device according to an embodiment of the present disclosure.

Referring to FIG. 5, any one of a plurality of semiconductor memory devices commonly connected to a controller through one channel is shown. The semiconductor memory device 300 according to an embodiment of the present disclosure includes first to fourth planes 301 to 304 and read and write circuits 331 to 334 corresponding thereto, respectively. That is, a first read and write circuit 331 corresponds to the first plane 301, a second read and write circuit 332 corresponds to the second plane 302, a third read and write circuit 333 corresponds to the third plane 303, and a fourth read and write circuit 334 corresponds to the fourth plane 304. In FIG. 5, the address decoder, the voltage generator, the control logic, and the like are omitted. In addition, although the semiconductor memory device 300 including the four planes is shown in the embodiment of FIG. 5, the present disclosure is not limited thereto. The semiconductor memory device according to the present disclosure may include only one plane or may include two planes. In addition, various numbers of planes may be included in the semiconductor memory device according to the present disclosure as needed.

According to the semiconductor memory device according to an embodiment of the present disclosure, each of the read and write circuits 331 to 334 may receive the user data from the channel and program the user data in a corresponding plane. In addition, according to the semiconductor memory device according to an embodiment of the present disclosure, each of the read and write circuits 331 to 334 may generate the parity data by performing an XOR operation on a plurality of user data corresponding to different planes, and program the generated parity data into the corresponding plane. The read and write circuit according to an embodiment of the present disclosure is described in more detail with reference to FIG. 6.

Figure 6:
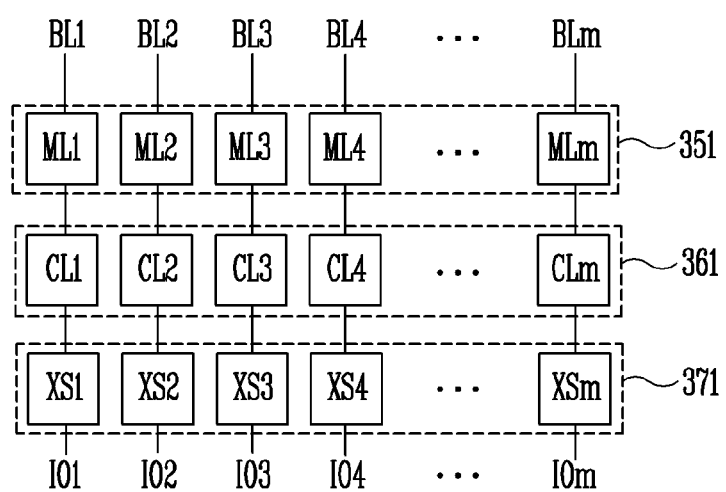
FIG. 6 is a block diagram illustrating an embodiment of a read and write circuit of FIG. 5.

FIG. 6 is a block diagram illustrating an embodiment of the read and write circuit 331 of FIG. 5.

In FIG. 6, a detailed configuration of the first read and write circuit 331 among the first to fourth read and write circuits 331 to 334 is shown. The second to fourth read and write circuits 332 to 334 may also have the same configuration as shown in FIG. 6.

Referring to FIG. 6, the first read and write circuit 331 includes a main buffer 351, a cache buffer 361, and a parity data generator 371. In addition, the first read and write circuit 331 may further include a page buffer circuit, but the page buffer circuit is omitted in FIG. 6 for convenience of discussion.

The main buffer 351 includes first to m-th main latches ML1 to MLm. The first to m-th main latches ML1 to MLm are connected to corresponding bit lines among the first to m-th bit lines BL1 to BLm. In addition, the cache buffer 361 includes first to m-th cache latches CL1 to CLm. The first to m-th cache latches CL1 to CLm may be connected to the first to m-th main latches ML1 to MLm.

The parity data generator 371 includes first to m-th XOR scramblers XS1 to XSm. The first to m-th XOR scramblers XS1 to XSm may be connected to the first to m-th cache latches CL1 to CLm.

The parity data generator 371 may receive data from first to m-th input/output lines IO1 to IOm. According to an embodiment of the present disclosure, the parity data generator 371 may selectively transmit the data input from the first to m-th input/output lines IO1 to IOm to the cache buffer 361. In addition, according to an embodiment of the present disclosure, the parity data generator 371 may perform an XOR operation on the data input from the first to m-th input/output lines IO1 to IOm and data stored in the cache buffer 361, and store an operation result in the cache buffer 361. Each XOR scrambler included in the parity data generator 371 is described with reference to FIG. 7.

Figure 7:
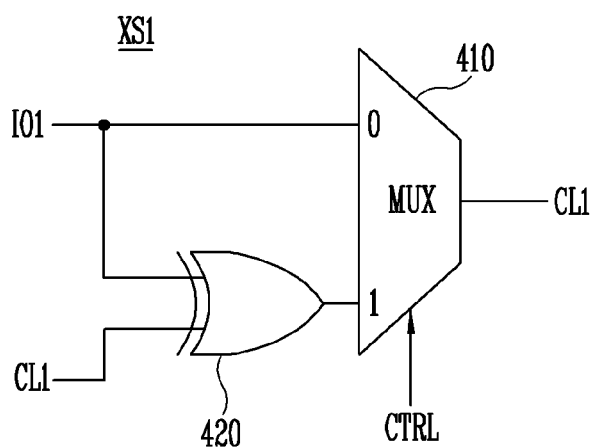
FIG. 7 is a diagram illustrating an embodiment of an exclusive-OR (XOR) scrambler of FIG. 6.

FIG. 7 is a diagram illustrating an embodiment of the XOR scrambler of FIG. 6.

Referring to FIG. 7, the first XOR scrambler XS1 is shown among the first to m-th XOR scramblers XS1 to XSm shown in FIG. 6. The second to m-th XOR scramblers XS2 to XSm may also have the same configuration as shown in FIG. 7.

According to an embodiment of the present disclosure, the first XOR scrambler may include a multiplexer 410 and an XOR gate 420. A first input terminal of the multiplexer 410 may be connected to the first input/output line IO1. In addition, a second input terminal of the multiplexer 410 may be connected to an output terminal of the XOR gate 420. The multiplexer 410 may output any one of an input from the first input terminal and an input from the second input terminal based on a control signal CTRL. An output terminal of the multiplexer 410 is connected to the first cache latch CL1.

Meanwhile, a first input terminal of the XOR gate 420 may be connected to the first input/output line IO1. In addition, a second input terminal of the XOR gate 420 may be connected to the first cache latch CL1. The output terminal of the XOR gate 420 is connected to the second input terminal of the multiplexer 410.

Referring to FIGS. 6 and 7, the multiplexer 410 may transmit bit data of the first input/output line IO1 to the first cache latch CL1, or may transmit a result of an XOR operation on the bit data of the first input/output line IO1 and bit data currently stored in the first cache latch CL1 back to the first cache latch CL1, according to the control signal CTRL. More specifically, as shown in FIG. 7, when the control signal CTRL has a logical value of "0", the multiplexer 410 transmits the bit data of the first input/output line IO1 to the first cache latch CL1. On the other hand, when the control signal CTRL has a logic value of "1", the multiplexer 410 transmits a result of an XOR operation on the bit data of the first input/output line IO1 and the bit data currently stored in the first cache latch CL1 back to the first cache latch CL1.

The control signal CTRL may be transmitted not only to the multiplexer 410 of the first XOR scrambler, but also to the multiplexers of the second to m-th XOR scramblers XS2 to XSm. Accordingly, the parity data generator 371 may transmit the data input from the first to m-th input/output lines IO1 to IOm to the cache buffer 361 as it is, or may perform an XOR operation on the data input from the first to m-th input/output lines IO1 to IOm and the data stored in the cache buffer 361 and transmit a result of the operation back to the cache buffer 361, based on the control signal CTRL. More specifically, when the control signal CTRL has a logical value of "0", the parity data generator 371 transmits the data input from the first to m-th input/output lines IO1 to IOm to the cache buffer 361. On the other hand, when the control signal CTRL has a logical value of "1", the parity data generator 371 transmits a result of an XOR operation on the data input from the first to m-th input/output lines IO1 to IOm and the data stored in the cache buffer 361 back to the cache buffer 361.

An embodiment of the present disclosure in which the parity data is generated using the parity data generator 371 is described later with reference to FIGS. 8 to 11.

FIG. 8 is a diagram illustrating a super page stored in semiconductor memory devices according to an embodiment of the present disclosure.

Referring to FIG. 8, a plurality of semiconductor memory devices 300a, 300b, 300c, and 300d connected to a first channel are shown. Each of the plurality of semiconductor memory devices 300a, 300b, 300c, and 300d may be configured as the semiconductor memory device 300 described with reference to FIGS. 5 to 7.

In FIG. 8, each of the semiconductor memory devices 300a, 300b, 300c, and 300d includes four planes P1, P2, P3, and P4. That is, a first semiconductor memory device 300a includes first to fourth planes 301a, 302a, 303a, and 304a, a second semiconductor memory device 300b includes first to fourth planes 301b, 302b, 303b, and 304b, a third semiconductor memory device 300c includes first to fourth planes 301c, 302c, 303c, and 304c, and a fourth semiconductor memory device 300d includes first to fourth planes 301d, 302d, 303d, and 304d.

First to fourth user data UD1 to UD4 may be stored in the first to fourth planes 301a, 302a, 303a, and 304a of the first semiconductor memory device 300a, respectively. Fifth to eighth user data UD5 to UD8 may be stored in the first to fourth planes 301b, 302b, 303b, and 304b of the second semiconductor memory device 300b, respectively. Ninth to twelfth user data UD9 to UD12 may be stored in the first to fourth planes 301c, 302c, 303c, and 304c of the third semiconductor memory device 300c, respectively. Thirteenth to fifteenth user data UD13 to UD15 and parity data PD may be stored in the first to fourth planes 301d, 302d, 303d, and 304d of the fourth semiconductor memory device 300d, respectively.

Each of the first to fifteenth user data UD1 to UD15 and the parity data PD may be data stored in one page. In addition, the first to fifteenth user data UD1 to UD15 and the parity data PD may configure one super page data SPD. According to the present disclosure, when each of the first to fifteenth user data UD1 to UD15 is input to a corresponding semiconductor memory device, the first to fifteenth user data UD1 to UD15 are also input to a read and write circuit corresponding to a fourth plane 304d in which the parity data PD is to be stored. This is described in detail with reference to FIGS. 9A to 9E.

FIGS. 9A to 9E are diagrams illustrating a method of storing parity data using a semiconductor memory device according to an embodiment of the present disclosure. In FIGS. 9A to 9D, only the first to third planes 301a, 302a, and 303a, included in the first semiconductor memory device 300a, and the fourth plane 304d included in the fourth semiconductor memory device 300d, among the 16 planes shown in FIG. 8 are shown.

Figure 9A:
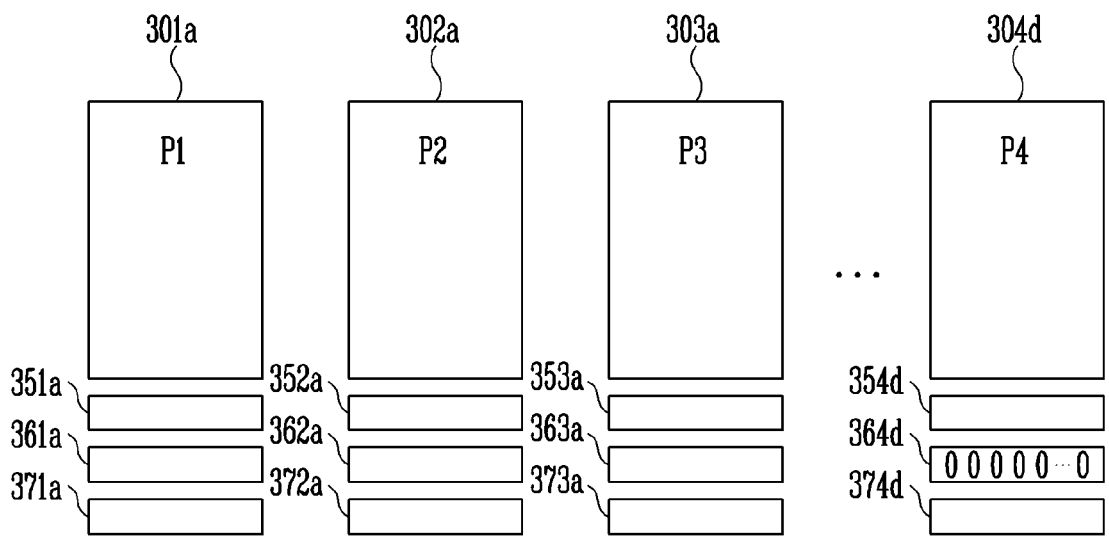
FIGS. 9A, 9B, 9C, 9D, and 9E are diagrams illustrating a method of storing parity data using a semiconductor memory device according to an embodiment of the present disclosure.

Referring to FIG. 9A, an initialization state before the first to fifteenth user data UD1 to UD15 is input is shown. In the initialization state, a cache buffer 364d corresponding to the fourth plane 304d to which the parity data PD is input is initialized. Specifically, the cache latches CL1 to CLm included in the cache buffer 364d corresponding to the fourth plane 304d store bit data of "0".

Figure 9B:
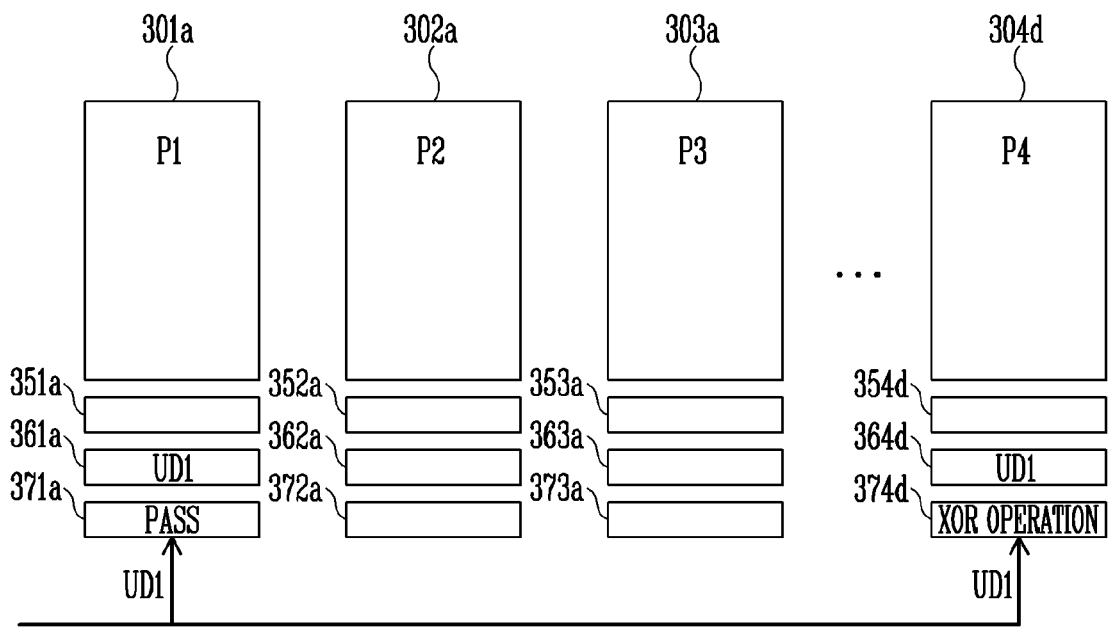

Referring to FIG. 9B, the first user data UD1 is input through the first channel CH1. Meanwhile, together with the input of the first user data UD1, an address into which the first user data UD1 is to be programmed is input. The address into which the first user data UD1 is to be programmed is the first plane 301a of the first semiconductor memory device 300a. In response to the address into which the first user data UD1 is to be programmed, a parity data generator 371a corresponding to the first plane 301a transmits the first user data UD1 to a corresponding cache buffer 361a. That is, the parity data generator 371a is in a "pass" state. An operation of the XOR scrambler included in the parity data generator 371a when the parity data generator 371a is in the pass state is described later with reference to FIG. 10A.

Meanwhile, together with the input of the first user data UD1, an address into which the parity data PD is to be programmed is input. The address into which the parity data PD is to be programmed is the fourth plane 304d of the fourth semiconductor memory device 300d. In response to the address into which the parity data PD is to be programmed, a parity data generator 374d corresponding to the fourth plane 304d performs an XOR operation.

Specifically, as described above with reference to FIGS. 6 and 7, the parity data generator 374d performs an XOR operation on the first user data UD1 and data stored in the cache buffer 364d. Since only bits of "0" are stored in the cache buffer 364d in the initial state, a result of the XOR operation is the same as the first user data UD1. Therefore, the first user data UD1 is stored in the cache buffer 364d.

That is, the parity data generator 374d is in an "XOR operation" state. An operation of the XOR scrambler included in the parity data generator 374d when the parity data generator 374d is in the operation state is described later with reference to FIG. 10B.

Figure 9C:
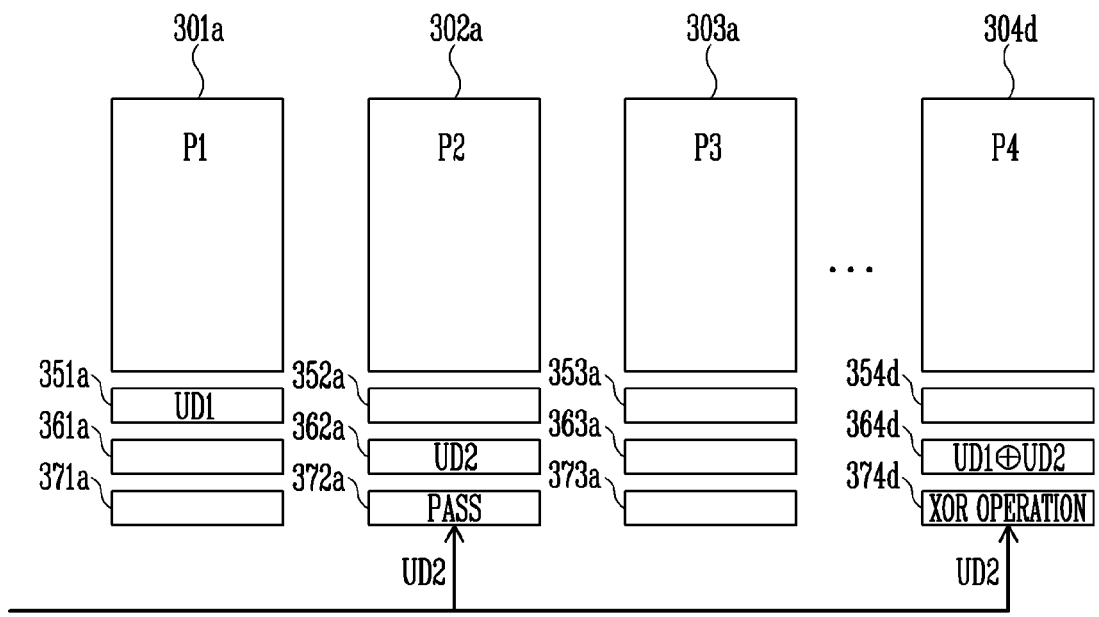

Referring to FIG. 9C, the first user data UD1 transmitted to the cache buffer 361a in a previous step may be transmitted to a main buffer 351a. In addition, the second user data UD2 is input through the first channel CH1. Meanwhile, together with the input of the second user data UD2, an address into which the second user data UD2 is to be programmed is input. The address into which the second user data UD2 is to be programmed is the second plane 302a of the first semiconductor memory device 300a. In response to the address into which the second user data UD2 is to be programmed, a parity data generator 372a corresponding to the second plane 302a transmits the second user data UD2 to a corresponding cache buffer 362a.

Meanwhile, together with the input of the second user data UD2, the address into which the parity data PD is to be programmed is input. As described above, the address into which the parity data PD is to be programmed is the fourth plane 304d of the fourth semiconductor memory device 300d. Therefore, in response to the address into which the parity data PD is to be programmed, the parity data generator 374d corresponding to the fourth plane 304d performs an XOR operation.

Specifically, the parity data generator 374d performs an XOR operation on the second user data UD2 and the data stored in the cache buffer 364d. Since the first user data UD1 is stored in the cache buffer 364d in the previous step described with reference to FIG. 9B, a result of an XOR operation on the first user data UD1 and the second user data UD2 is stored in the cache buffer 364d.

In such a method, the third to fifteenth user data UD3 to UD15 may be sequentially input to the cache buffer and the main buffer of the corresponding plane.

Figure 9D:
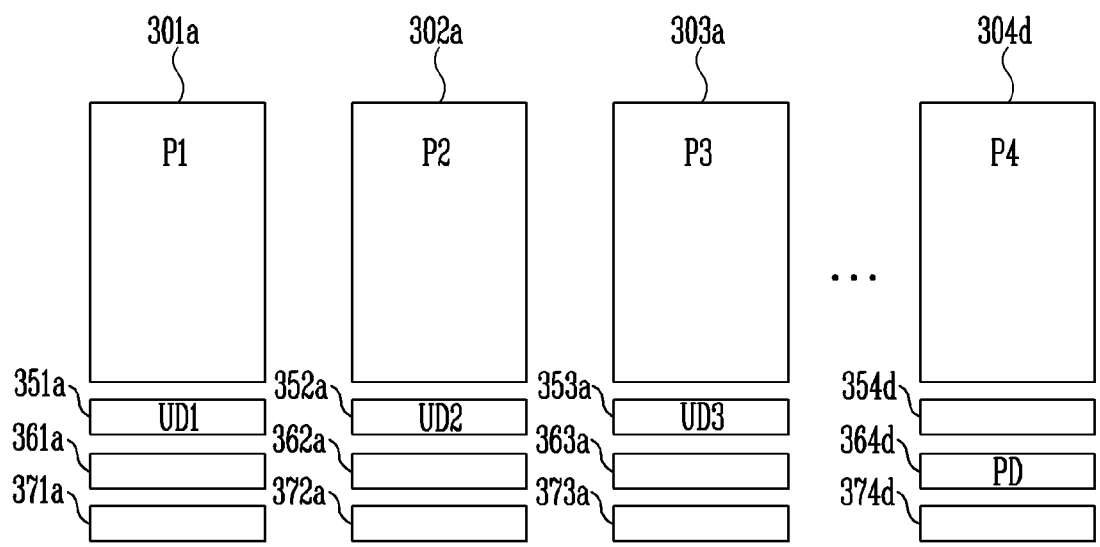

Referring to FIG. 9D, the first to fifteenth user data UD1 to UD15 are sequentially input to the main buffer through the corresponding parity data generator and cache buffer. In addition, parity data PD, which is a result of sequentially performing an XOR operation on the first to fifteenth user data UD1 to UD15, is stored in the cache buffer 364d.

Figure 9E:
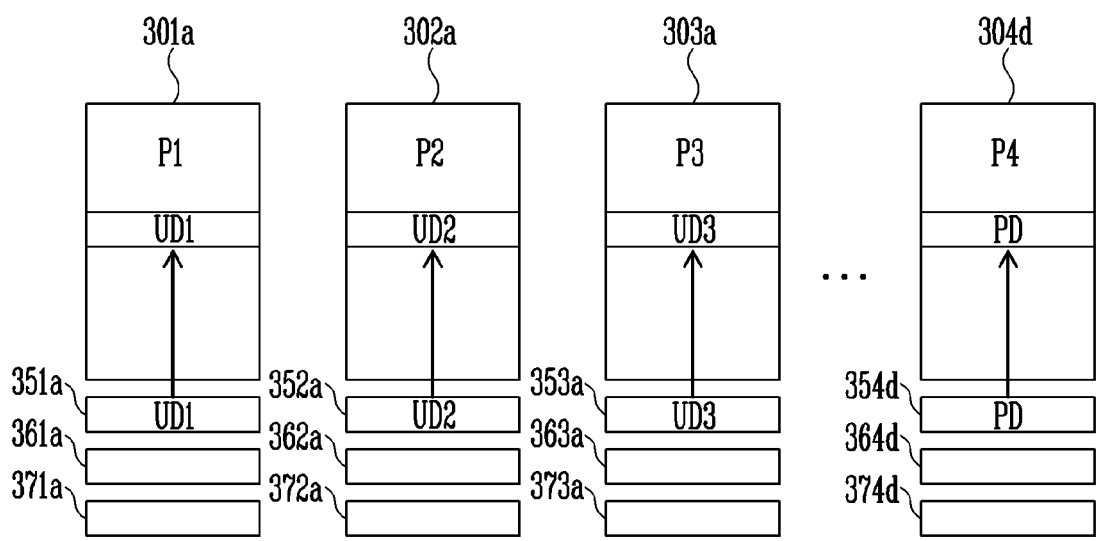

Thereafter, referring to FIG. 9E, data of the main buffer are programmed into corresponding planes, respectively. A program result of FIG. 9E is substantially the same as that described with reference to FIG. 4.

However, there is a difference in that the fourth semiconductor memory device 300d generates the parity data PD in an example of FIGS. 9A to 9E whereas the controller 200 generates the parity data PD and flushes the first to fifteenth user data UD1 to UD15 and the parity data PD to the semiconductor memory devices 100a to 100d in an example of FIG. 4. That is, according to the present disclosure, the controller 200 is not required to maintain the first to fifteenth user data UD1 to UD15 and the parity data PD. Therefore, in an embodiment, the buffer memory of the controller 200 may be efficiently used.

Figure 10A:
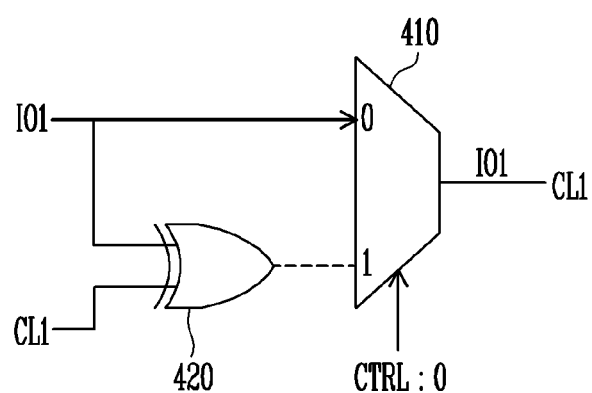
FIGS. 10A and 10B are diagrams illustrating an operation of the XOR scrambler when a parity data generator is in a pass state or an XOR operation state.
Figures 10B, 11:
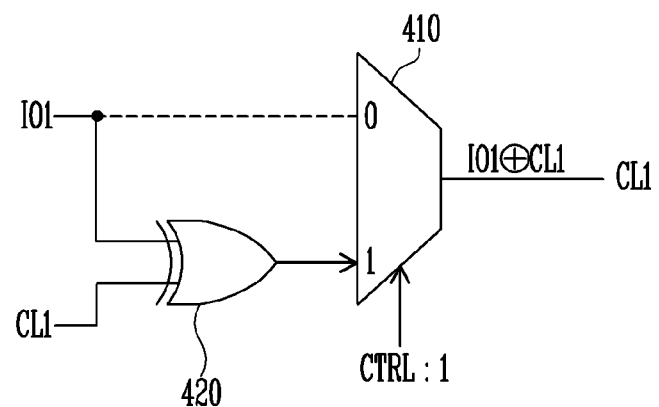
FIG. 11 is a diagram illustrating a program command transmitted from a controller to a semiconductor memory device according to an embodiment of the present disclosure.

FIGS. 10A and 10B are diagrams illustrating the operation of the XOR scrambler when the parity data generator is in the pass state or the XOR operation state.

Referring to FIG. 10A, a parity data generator corresponding to a plane indicated by a program address into which received data is to be programmed is in the pass state. In this case, the control signal CTRL input to the parity data generator has a value of "0". Therefore, the multiplexer 410 of each XOR scrambler transmits a bit input to an input/output line to a corresponding cache latch.

Referring to FIG. 10B, a parity data generator corresponding to a plane indicated by an address into which the parity data is to be programmed is in the XOR operation state. In this case, the control signal CTRL input to the parity data generator has a value of "1". Therefore, the multiplexer 410 of each XOR scrambler transmits a bit output from the XOR gate to the cache latch. Accordingly, the parity data generator performs an XOR operation on the data stored in the cache buffer and the user data input to the input/output line, and stores the operation result in the cache buffer again.

FIG. 11 is a diagram illustrating a program command transmitted from a controller to a semiconductor memory device according to an embodiment of the present disclosure.

Referring to FIG. 11, a program command 500 may include a program address PGM ADDR, a parity address PARITY ADDR into which the parity data is to be programmed, and program data DATA.

For example, when the first user data UD1 is programmed, the controller 200 may transmit a program command including a program address PGM ADDR indicating the first plane 301a of the first semiconductor memory device 300a, a parity address indicating the fourth plane 304d of the fourth semiconductor memory device 300d, and the first user data UD1 through the first channel. Among the first to fourth semiconductor memory devices, the parity data generator 371a of the first semiconductor memory device 300a may transmit the first user data UD1 to the cache buffer 361a in response to the program address PGM ADDR indicating the first plane 301a. In addition, among the first to fourth semiconductor memory devices, the parity data generator 374d of the fourth semiconductor memory device 300d may perform an XOR operation on the first user data UD1 and data stored in the cache buffer 364d, and store a result of the XOR operation in the cache buffer 364d.

In addition, when the second user data UD2 is programmed, the controller 200 may transmit a program command including a program address PGM ADDR indicating the second plane 302a of the first semiconductor memory device 300a, a parity address indicating the fourth plane 304d of the fourth semiconductor memory device 300d, and the second user data UD2 through the first channel. Among the first to fourth semiconductor memory devices, the parity data generator 372a of the first semiconductor memory device 300a may transmit the second user data UD2 to the cache buffer 362a in response to the program address PGM ADDR indicating the second plane 302a. In addition, among the first to fourth semiconductor memory devices, the parity data generator 374d of the fourth semiconductor memory device 300d may perform an XOR operation on the second user data UD2 and data stored in cache buffer 364d in response to the parity address PARITY ADDR indicating the fourth plane 304d, and store a result of the XOR operation in the cache buffer 364d.

FIG. 12 is a diagram illustrating a case in which a read fail occurs in partial data of super page data stored in semiconductor memory devices according to an embodiment of the present disclosure. More specifically, a situation in which the read fail occurs in the second user data UD2 among the first to fifteenth user data UD1 to UD15 after the super page data SPD is stored through a process of FIGS. 9A to 9E is shown.

As an example of a method, the first user data UD1, the third to fifteenth user data UD3 to UD15, and the parity data PD may be read under control of the controller. The read first user data UD1, third to fifteenth user data UD3 to UD15, and parity data PD may be transmitted to the controller. The controller may perform an XOR operation on all of the received first user data UD1, third to fifteenth user data UD3 to UD15, and parity data PD to recover second user data UD2.

According to such a method, in order to recover the second user data UD2, the controller 200 is required to maintain all of the first user data UD1, the third to fifteenth user data UD3 to UD15, and the parity data PD in the buffer memory. As a size of the super page data SPD increases, a buffer memory space for maintaining the super page data SPD also increases. In an embodiment, this may be a burden on the limited buffer memory in the controller 200.

According to an embodiment of the present disclosure, when recovering read-failed user data, any one of the semiconductor memory devices generates the parity data without performing an XOR operation. Specifically, among the plurality of semiconductor memory devices connected to one channel, a semiconductor memory device storing read-failed user data may perform an XOR operation. Hereinafter, a present disclosure is described with reference to FIGS. 13A to 13E.

FIGS. 13A to 13E are diagrams illustrating a method of recovering data in which a read fail occurs according to an embodiment of the present disclosure in a case of FIG. 12.

Figure 13A:
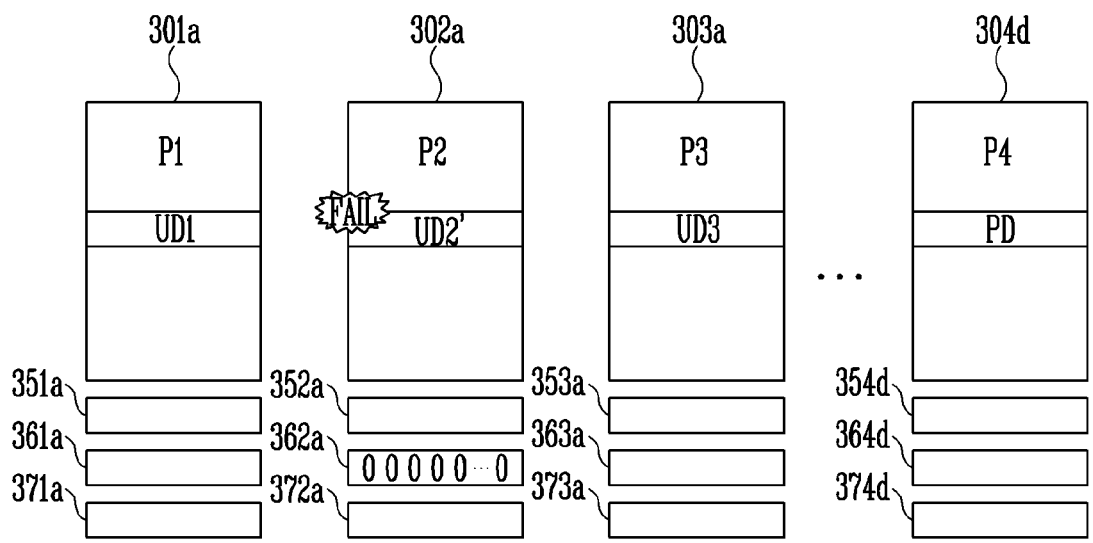
FIGS. 13A, 13B, 13C, 13D, and 13E are diagrams illustrating a method of recovering data in which a read fail occurs according to an embodiment of the present disclosure in a case of FIG. 12.

Referring to FIG. 13A, second user data UD2' is data including an uncorrectable error in the original second user data UD2. Therefore, a read fail with respect to the second user data UD2' is generated. In this case, the cache buffer 362a corresponding to the second plane 302a may be initialized to recover the second user data. Specifically, the cache latches CL1 to CLm included in the cache buffer 362a corresponding to the second plane 302a store bit data of "0".

Figure 13B:
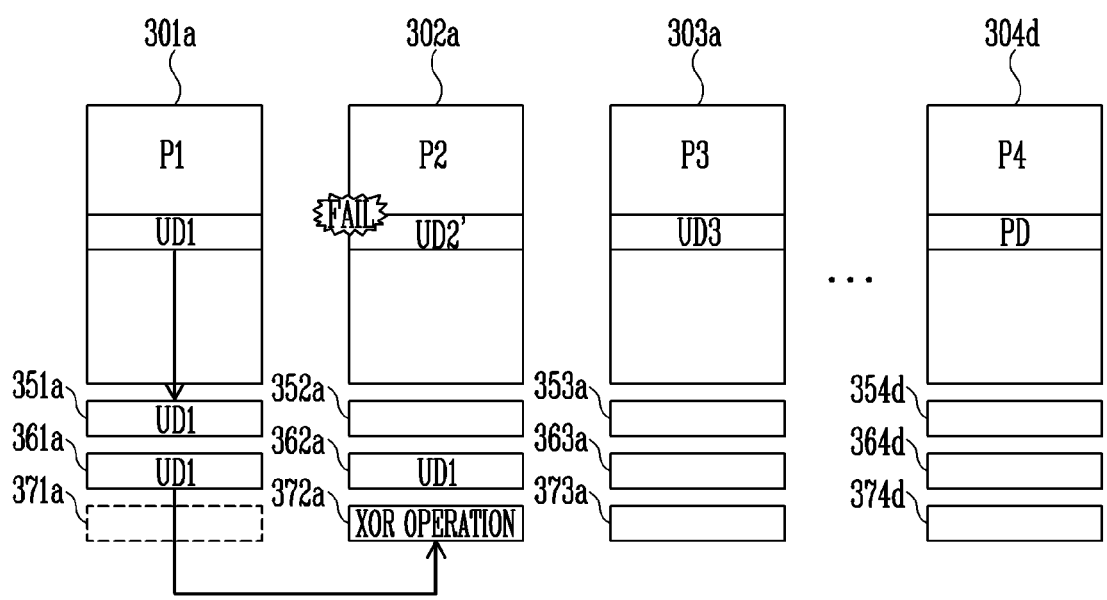

Referring to FIG. 13B, the first user data UD1 is read according to the read command from the controller 200. The read command of the controller 200 may include a read address indicating a position where the first user data UD1 is stored. In response to the read address, the first semiconductor memory device 300a reads the first user data UD1. The first user data UD1 is output through the main buffer 351a and the cache buffer 361a. In an output path of data, the cache buffer 361a may be directly connected to the first channel and might not pass through the parity data generator 371a. Accordingly, the first user data UD1 is directly output from the cache buffer 361a to the first channel.

Meanwhile, the read command of the controller 200 may include an address indicating a data recovery position as well as the read address. The address indicating the recovery position corresponds to a position where the read fail occurs. In response to the read address indicating the recovery position, the parity data generator 372a corresponding to the second plane 302a of the first semiconductor memory device 300a may perform an XOR operation on the first user data UD1 output to the first channel and data stored in the cache buffer 362a, and store a result of the XOR operation in the cache buffer 362a again.

Specifically, the parity data generator 372a performs an XOR operation on the first user data UD1 output to the first channel and the data stored in the cache buffer 362a. Since only bits of "0" are stored in the cache buffer 362a in the initial state, the result of the XOR operation is the same as the first user data UD1. Therefore, the first user data UD1 is stored in the cache buffer 362a.

Figure 13C:
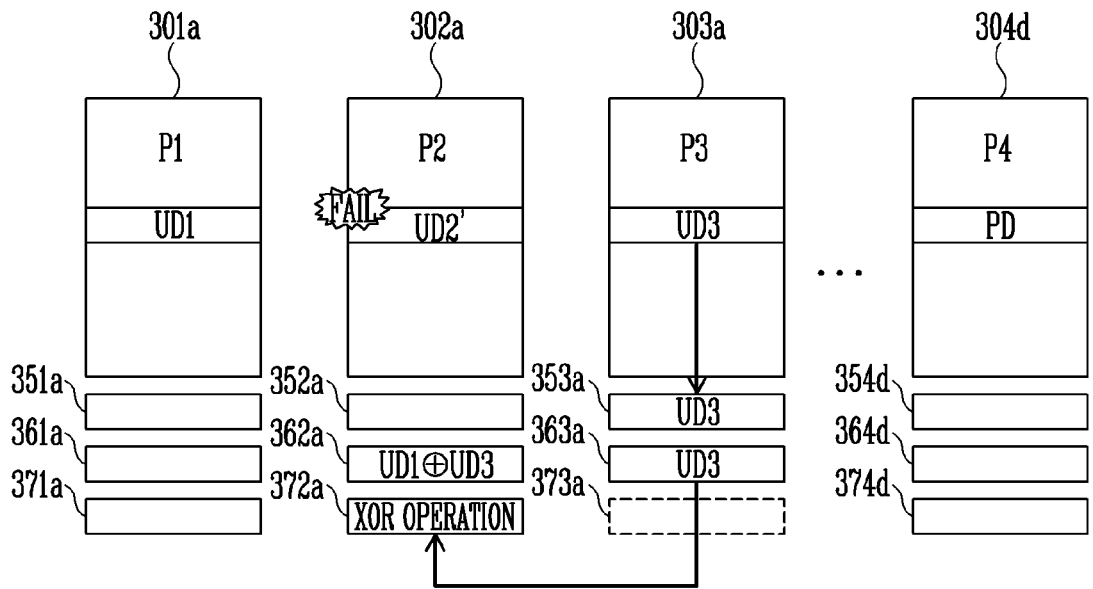

Referring to FIG. 13C, the third user data UD3 is read according to the read command from the controller 200. The read command of the controller 200 may include a read address indicating a position where the third user data UD3 is stored. In response to the read address, the first semiconductor memory device 300a reads the third user data UD3. The third user data UD3 is output to the first channel through the main buffer 353a and the cache buffer 363a.

Meanwhile, the read command of the controller 200 may include an address indicating a data recovery position as well as the read address. In response to the read address indicating the recovery position, the parity data generator 372a corresponding to the second plane 302a of the first semiconductor memory device 300a may perform an XOR operation on the second user data UD2 output to the channel and the data stored in the cache buffer 362a, and store a result of the XOR operation in the cache buffer 362a again.

Specifically, the parity data generator 372a performs an XOR operation on the second user data UD2 output to the first channel and the first user data UD1 stored in the cache buffer 362a, and store the result of the XOR operation in the cache buffer 362a.

In such a method, the fourth to fifteenth user data UD4 to UD15 may be sequentially read. As the fourth to fifteenth user data UD4 to UD15 are read, an accumulated result obtained by performing an XOR operation on corresponding data is stored in the cache buffer 362a.

Figure 13D:
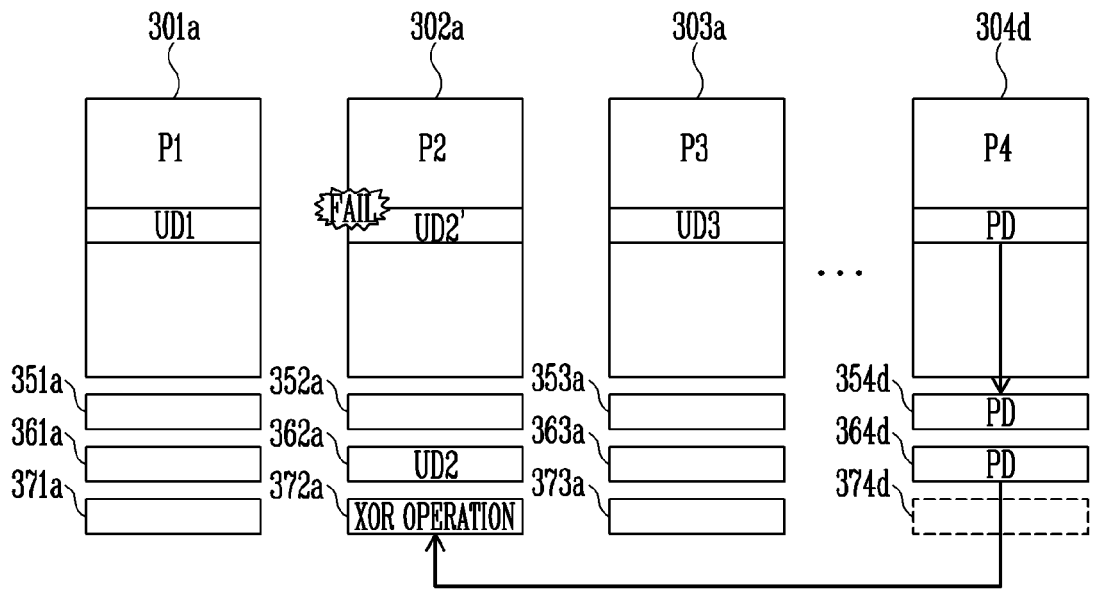

Thereafter, as shown in FIG. 13D, finally, the parity data PD is read and output to the first channel. The parity data generator 372a performs an XOR operation on the parity data PD output to the first channel and the data stored in the cache buffer 362a. As a result, data obtained by performing an operation on the first user data UD1, the third to fifteenth user data UD3 to UD15, and the parity data PD is stored in the cache buffer 362a.

The result of performing the operation on the first user data UD1, the third to fifteenth user data UD3 to UD15, and the parity data PD becomes the second user data UD2. Consequently, the second user data UD2 is recovered and stored in the cache buffer 362a.

Figure 13E:
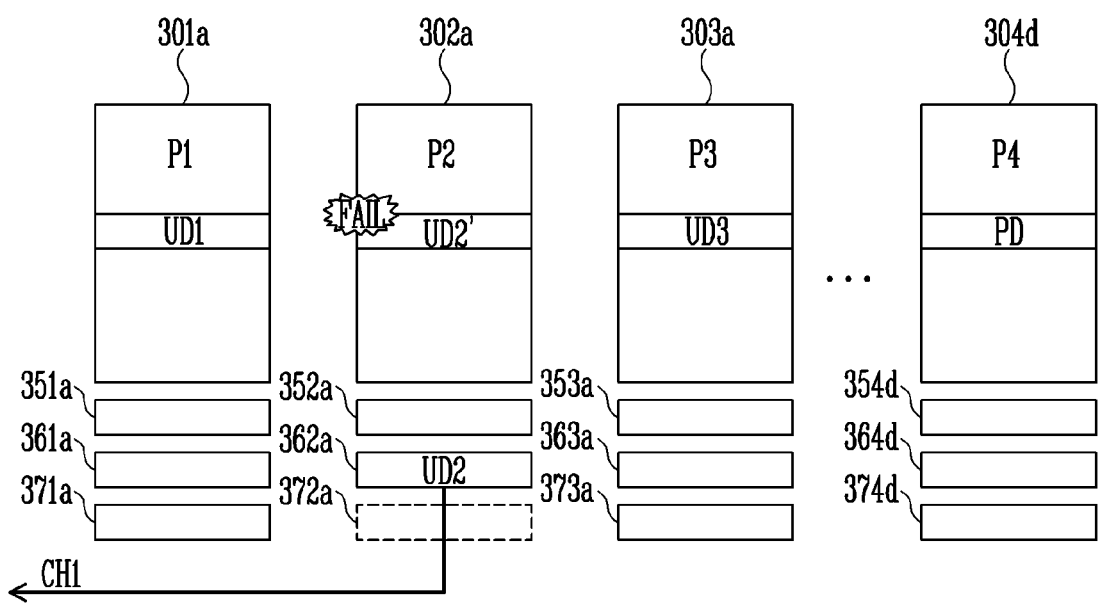

Thereafter, as shown in FIG. 13E, the recovered second user data UD2 may be transmitted to the controller 200 through the first channel CH1.

As described with reference to FIGS. 13A to 13E, according to an embodiment of the present disclosure, when the read-failed user data is recovered, the semiconductor memory device storing the read-failed user data may perform an XOR operation. That is, according to an embodiment, the controller 200 is not required to maintain the first to fifteenth user data UD1 to UD15 and the parity data PD in order to recover the read-failed data. Therefore, in an embodiment, the buffer memory of the controller 200 may be efficiently used.

Figure 14:
FIG. 14 is a diagram illustrating a read command transmitted from a controller to a semiconductor memory device according to an embodiment of the present disclosure.

FIG. 14 is a diagram illustrating a read command transmitted from a controller to a semiconductor memory device according to an embodiment of the present disclosure.

Referring to FIG. 14, the read command 600 may include a read address READ ADDR and a recovery address RECOVERY ADDR corresponding to data to be recovered.

For example, when the second user data UD2 is read-failed, the recovery address RECOVERY ADDR indicates the second plane 302a of the first semiconductor memory device 300a in which the second user data is stored. In order to read the first user data UD1, the controller 200 may transmit the read command including the read address READ ADDR indicating to the first plane 301a of the first semiconductor memory device 300a and the recovery address RECOVERY ADDR indicating the second plane 302a to the first channel.

In response to the read address READ ADDR indicating the first plane 301a, the first user data UD1 may be read and output to the first channel. In addition, in response to the recovery address RECOVERY ADDR indicating the second plane 302a, the parity data generator 372a corresponding to the second plane 302a may perform an XOR operation on the first user data UD1 output to the first channel and the data stored in the cache buffer 362a, and store a result of the XOR operation in the cache buffer 362a.

Thereafter, in order to read the third user data UD3, the controller 200 may transmit the read command including the read address READ ADDR indicating the third plane 303a of the first semiconductor memory device 300a and the recovery address RECOVERY ADDR indicating the second plane 302a to the first channel.

In response to the read address READ ADDR indicating the third plane 303a, the third user data UD3 may be read and output to the first channel. In addition, in response to the recovery address RECOVERY ADDR indicating the second plane 302a, the parity data generator 372a corresponding to the second plane 302a may perform an XOR operation on the third user data UD3 output to the first channel and the data stored in the cache buffer 362a, and store a result of the XOR operation in the cache buffer 362a.

In such a method, the controller 200 may sequentially output a read command for reading the fourth to fifteenth user data and a read command for reading the parity data. A result of sequentially performing an XOR operation on the first user data UD1, the third to fifteenth user data UD3 to UD15, and the parity data PD may be stored in the cache buffer 362a, by the read commands.

FIG. 15 is a flowchart illustrating a method of operating a semiconductor memory device according to an embodiment of the present disclosure.

Referring to FIG. 15, a method of operating a semiconductor memory device according to an embodiment of the present disclosure includes receiving first program data, a first program address, and a parity address from a controller (S110), storing the received first program data in a cache buffer corresponding to the parity address (S120), receiving second program data, a second program address, and the parity address from the controller (S130), performing an XOR operation on the first program data and the second program data, and storing an operation result in the cache buffer corresponding to the parity address (S140), and programming the parity data stored in the cache buffer into a page corresponding to the parity address (S150).

In step S110, the controller may transmit the program command 500 as shown in FIG. 11 to the semiconductor memory device. As described above, the program command 500 may include the program address PGM ADDR, the parity address PARITY ADDR into which the parity data is to be programmed and the program data DATA. The first program data received in step S110 may be the first user data UD1 shown in FIGS. 9A to 9E.

In step S120, the semiconductor memory device stores the received first program data in the cache buffer corresponding to the parity address. As described above with reference to FIG. 9B, the first user data UD1 input through the first channel CH1 may be stored in the cache buffer 361a corresponding to the first program address and the cache buffer 364d corresponding to the parity address.

In step S130, the semiconductor memory device may receive the second program data, the second program address, and the parity address from the controller. The second program data received in step S130 may be the second user data UD2 shown in FIGS. 9A to 9E.

In step S140, the semiconductor memory device may perform an XOR operation on the first program data stored in the cache buffer 364d corresponding to the parity address and the second program data received in step S130. As shown in FIG. 9C, the parity data generator 374d corresponding to the parity address may perform an XOR operation on the first user data UD1 stored in the cache buffer 364d and the received second user data UD2. Meanwhile, data resulting from the XOR operation of the first user data UD1 and the second user data UD2 is stored in the cache buffer corresponding to the parity address.

Thereafter, in step S150, the parity data stored in the cache buffer may be programmed into a page corresponding to the parity address. In FIG. 15, an embodiment of generating the parity data by performing an XOR operation on the first and second program data is shown. That is, in an example of FIG. one super page may include two user data and one parity data.

However, the present disclosure is not limited thereto, and additional steps may be further performed according to the number of user data included in the super page. For example, when the super page includes first to third program data and the parity data, after step S140, receiving the third program data and performing an XOR operation may be further performed. As described above, an additional XOR operation may be further performed according to the number of user data included in the super page.

Meanwhile, only the operation of programming the parity data is shown in step S150, but an operation of respectively programming the first program data and the second program data in corresponding pages may also be performed simultaneously.

FIG. 16 is a flowchart illustrating a method of operating a semiconductor memory device according to another embodiment of the present disclosure.

Referring to FIG. 16, a method of operating a semiconductor memory device according to an embodiment of the present disclosure includes reading first data corresponding to a first read address received from a controller, in response to the first read address (S210), storing the first data in a cache buffer corresponding to a recovery address received from the controller, in response to the recovery address (S220), reading second data corresponding to a second read address received from the controller, in response to the second read address (S230), performing an XOR operation on the first data and the second data, and storing an operation result in the cache buffer corresponding to the recovery address (S240), and transmitting recovery data stored in the cache buffer to the controller (S250).

Immediately before step S210, the controller may transmit a read command 600 as shown in FIG. 14 to the semiconductor memory device. As described above, the read command 600 may include the read address READ ADDR and the recovery address RECOVERY ADDR. In step S210, the semiconductor memory device reads corresponding first data in response to a first read address. The first data may be the first user data UD1 shown in FIGS. 13A to 13E.

In step S220, in response to the recovery address received together with the first read address, the controller may store the first data read in step S210 in a cache buffer corresponding to the recovery address. According to an example shown in FIGS. 13A to 13E, the recovery address may correspond to a position where a read fail occurs. As shown in FIG. 13B, the first data, that is, the first user data UD1 may be stored in the cache buffer 362a corresponding to the recovery address.

Meanwhile, immediately before step S230, the controller may transmit a read command including a second address and a recovery address to the semiconductor memory device. In step S230, the semiconductor memory device reads second data in response to the second read address. In an embodiment, the second read data may be the parity data PD.

In step S240, the semiconductor memory device performs an XOR operation on the first data and the second data, and stores an operation result in the cache buffer corresponding to the recovery address. That is, data as a result of the XOR operation on the first data and the second data may be stored in the cache buffer 362a as the recovery data.

Thereafter, in step S250, the semiconductor memory device transmits the recovery data stored in the cache buffer 362a to the controller 200.

In FIG. 16, an embodiment of generating recovery data by performing the XOR operation on the first and second data is shown. That is, in an example of FIG. 16, any one of the first and second data is the parity data PD. In addition, in the example of FIG. 16, one super page may include two user data and one parity data.

However, the present disclosure is not limited thereto, and additional steps may be further performed according to the number of user data included in the super page. For example, when the super page includes first to third program data and the parity data, after step S240, receiving the third data and performing an XOR operation may be further performed. As described above, an additional XOR operation may be further performed according to the number of user data included in the super page.

What is claimed is:

1. A semiconductor device comprising:
   a memory cell array including a plurality of planes; and
   a plurality of read and write circuits corresponding to the plurality of planes, respectively,
   wherein any one of the read and write circuits generates parity data based on data sequentially received from a controller through a channel.

2. The semiconductor device of claim 1, wherein any one of the read and write circuits sequentially receives first and second data through the channel, generates the parity data by performing an exclusive-OR (XOR) operation on the first and second data, and programs the parity data into a corresponding plane.

3. The semiconductor device of claim 2, wherein any one of the read and write circuits comprises:
   a main buffer connected to the corresponding plane through a plurality of bit lines;
   a cache buffer connected to the main buffer; and
   a parity data generator connected to the cache buffer.

4. The semiconductor device of claim 3, wherein the main buffer comprises a plurality of main latches connected to the plurality of bit lines, respectively,
   the cache buffer includes a plurality of cache latches connected to the plurality of main latches, respectively,
   the parity data generator includes a plurality of XOR scramblers connected to the plurality of cache latches, respectively, and
   each of the plurality of XOR scramblers selectively transmits bit data input from a corresponding input and output (input/output) line to a corresponding cache latch in response to a control signal of a first state.

5. The semiconductor device of claim 4, wherein each of the plurality of XOR scramblers performs an XOR operation on the bit data input from the corresponding input/output line and bit data stored in a corresponding cache latch in response to the control signal of a second state.

6. The semiconductor device of claim 5, wherein each of the plurality of XOR scramblers stores bit data generated as a result of the XOR operation in the corresponding cache latch.

7. The semiconductor device of claim 6, wherein each of the plurality of XOR scramblers comprises a multiplexer and an XOR gate,
   a first input, a second input, and an output of the multiplexer are connected to the corresponding input/output line, an output of the XOR gate, and the corresponding cache latch, respectively, and
   a first input and a second input of the XOR gate are connected to the corresponding input/output line and the corresponding cache latch, respectively.

8. The semiconductor device of claim 7, wherein the first input of the multiplexer is connected to the output of the multiplexer in response to the control signal of the first state.

9. The semiconductor device of claim 7, wherein the second input of the multiplexer is connected to the output of the multiplexer in response to the control signal of the second state.

10. The semiconductor device of claim 4, wherein the control signal of the first state is applied to a parity data generator corresponding to a first address included in a read command received from the controller, in response to the first address.

11. The semiconductor device of claim 10, wherein the control signal of the second state is applied to a parity data generator corresponding to a second address included in the read command received from the controller, in response to the second address.

12. A method of operating a semiconductor device, the method comprising:
   receiving first program data, a first program address, and a parity address from a controller connected to the semiconductor device through a channel;
   storing the first program data in a cache buffer corresponding to the parity address;
   receiving second program data, a second program address, and the parity address from the controller; and
   generating parity data based on the first and second program data.

13. The method of claim 12, wherein generating the parity data comprises:
   performing an exclusive-OR (XOR) operation on the first and second program data; and
   storing data generated as a result of the XOR operation as the parity data in a cache buffer corresponding to the parity address.

14. The method of claim 13, further comprising:
   programming the parity data into a page corresponding to the parity address.

15. The method of claim 14, further comprising:
programming the first program data into a page corresponding to the first program address; and
programming the second program data into a page corresponding to the second program address.

16. A method of operating a semiconductor device, the method comprising:
reading first data in response to a first address received from a controller connected to the semiconductor device through a channel;
storing the first data in a cache buffer corresponding to a recovery address received from the controller, in response to the recovery address;
reading second data in response to a second address received from the controller; and
generating recovery data based on the first and second data.

17. The method of claim 16, wherein generating the recovery data comprises:
performing an exclusive-OR (XOR) operation on the first and second data; and
storing data generated as a result of the XOR operation as the recovery data in a cache buffer corresponding to the recovery address.

18. The method of claim 17, further comprising transmitting the recovery data to the controller.

19. The method of claim 16, wherein any one of the first and second data is parity data.

* * * * *